(12) United States Patent
Phelps et al.

(10) Patent No.: US 7,346,868 B2
(45) Date of Patent: Mar. 18, 2008

(54) METHOD AND SYSTEM FOR EVALUATING DESIGN COSTS OF AN INTEGRATED CIRCUIT

(75) Inventors: Rodney M. Phelps, Pittsburgh, PA (US); Hongzhou Liu, Pittsburgh, PA (US); Amith Singhee, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 347 days.

(21) Appl. No.: 11/078,573

(22) Filed: Mar. 11, 2005

(65) Prior Publication Data

US 2006/0206839 A1  Sep. 14, 2006

(51) Int. Cl.
  *G06F 17/50* (2006.01)
(52) U.S. Cl. .............................. 716/4; 716/7
(58) Field of Classification Search ............ 716/4, 716/7
  See application file for complete search history.

(56) References Cited

U.S. PATENT DOCUMENTS

| 4,630,219 | A  | * | 12/1986 | DiGiacomo et al. ......... 716/9 |
| 5,530,372 | A  | * | 6/1996 | Lee et al. .................... 324/758 |
| 6,446,239 | B1 | * | 9/2002 | Markosian et al. ........... 716/2 |
| 6,449,761 | B1 | * | 9/2002 | Greidinger et al. .......... 716/11 |
| 6,789,232 | B1 | * | 9/2004 | Iyer et al. ..................... 716/1 |
| 6,931,617 | B2 | * | 8/2005 | Sanie et al. ................... 716/18 |
| 2004/0123260 | A1 | * | 6/2004 | Teig et al. .................... 716/7 |
| 2004/0210856 | A1 | * | 10/2004 | Sanie et al. .................. 716/2 |
| 2005/0097481 | A1 | * | 5/2005 | Mitsutake et al. ............ 716/2 |
| 2006/0031804 | A1 | * | 2/2006 | Alpert et al. ................ 716/10 |
| 2006/0085772 | A1 | * | 4/2006 | Zhang .......................... 716/4 |

FOREIGN PATENT DOCUMENTS

WO   WO 9824039 A1 * 6/1998

OTHER PUBLICATIONS del Mar Hershenson, M. et al. (1998). "GPCAD: A Tool for CMOS Op-Amp Synthesis," *Proceedings of the IEEE/ACM International Conference on Computer-Aided Design*, pp. 296-303.
Gielen, G.G.E. et al. (Dec. 2000). "Computer-Aided Design of Analog and Mixed-Signal Integrated Circuits," *Proceedings of the IEEE* 88(12):1825-1852.
Krasnicki, M. et al. (Jun. 1999). "MAELSTROM: Efficient Simulation-Based Synthesis for Custom Analog Cells," *Proceedings of the ACM/IEEE Design Automation Conference*, pp. 945-950.

(Continued)

*Primary Examiner*—Phallaka Kik
(74) *Attorney, Agent, or Firm*—Morrison & Foerster LLP

(57) ABSTRACT

Method and system for evaluating design costs of an integrated circuit are disclosed. The method includes choosing a design point for evaluation, dividing circuit specifications of the design point into at least two groups comprising a first group of specifications and a second group of specifications, computing a first set of design costs for the first group of specifications, estimating a second set of design costs for the second group of specifications using a predetermined set of reference costs, and determining a design cost of the design point using the first set of design costs and the second set of design costs.

36 Claims, 3 Drawing Sheets

OTHER PUBLICATIONS

Ochotta, E.S. et al. (1998). *Practical Synthesis of High-Performance Analog Circuits*, Kluwer Academic Publishers, pp. vii-xii. (Table of Contents Only), pp. vii-xii.

Phelps, R. et al. (Jun. 2000). "A Case Study of Synthesis for Industrial-Scale Analog IP: Redesign of the Equalizer/Filter Frontend for an ADSL CODEC," *ACM/IEEE Design Automation Conference*, pp. 1-6.

Phelps, R. et al. (Jun. 2000). "Anaconda: Simulation-Based Synthesis of Analog Circuits Via Stochastic Pattern Search," *IEEE Transactions on Computer-Aided Design of Integrated Circuits and Systems* 19(6):703-717.

\* cited by examiner

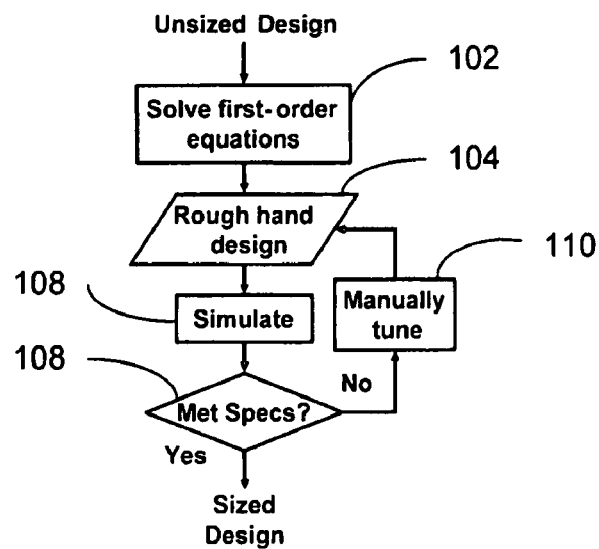
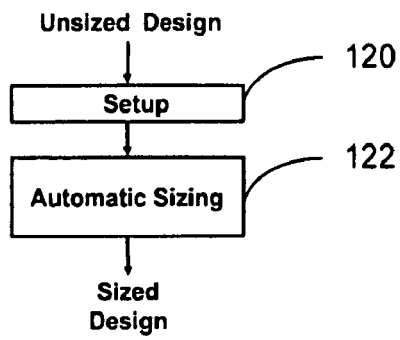
Figure 1a
(Prior Art)
Figure 1b
(Prior Art)
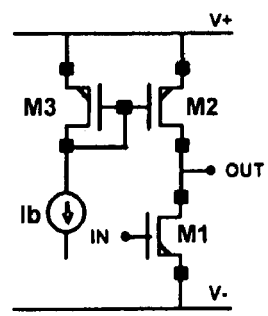
Figure 1c
(Prior Art)

METHOD AND SYSTEM FOR EVALUATING DESIGN COSTS OF AN INTEGRATED CIRCUIT

FIELD OF THE INVENTION

The present invention relates to the field of electronic design automation tools. In particular, the present invention relates to a method and system for evaluating design costs of an integrated circuit.

BACKGROUND OF THE INVENTION

The design process of an integrated circuit includes several steps: topology selection, sizing, and layout. Topology selection is the task of choosing an interconnection of circuit components to implement a desired function. Sizing is the process of choosing parameter values for each of the components in a topology. The process chooses component parameters, for example, the width (W) and the length (L) of a transistor. The component parameters are also referred to as design variables. Typically, a circuit designer defines a range of possible values for each design variable. The set of all combinations of design variable values is known as the design space. A design point is an element of the design space.

To size a circuit, one method uses handcrafted equations and various heuristics to the component parameters of different device sizes. FIG. 1a illustrates a conventional method for sizing an integrated circuit. The sizing method starts by receiving an unsized design. In step 102, the method solves the first-order equations representing the unsized design. In step 104, the method performs rough manual designs. In step 106, simulation is invoked to simulate the design. In step 108, a determination is made whether the outcome of the simulation from step 106 meets the user's design specifications. If the design specifications are not met, the method moves to step 110 where the design is manually adjusted, and the method continues in step 104. If the design specifications are met, a sized design is returned and the method ends.

FIG. 1b illustrates another conventional method for sizing an integrated circuit. In FIG. 1b, circuit synthesis with automatic sizing is used to replace the manual, designer-in-the-loop process of FIG. 1a. The method starts by receiving an unsized design. In step 120, the method handles the operations necessary for setting up the environment for performing an automatic sizing operation. In step 122, the automatic sizing operation is performed and a sized design is generated.

The process of automatic sizing visits and evaluates each design point in a design space, in an attempt to find a design point that satisfies the design specifications. The method for evaluating a design point consists of running simulations, gathering simulation results, and then computing the cost of the design point based on the simulation results. Typically, multiple simulations are required to evaluate each design point. An example of the simulation environment used in the sizing process is the Simulation Program with Integrated Circuit Emphasis (SPICE). The Spectre simulator from Cadence is an example of a commercially available SPICE simulator.

FIG. 1c illustrates an example of a design space with a three-transistor integrated circuit. The circuit includes M1, M2, and M3 as the three transistors of interest. Let x1={1u, 2u, . . . , 100u} and x2={5u, 6u, . . . , 500u}; and let M1.L=M2.L=M3.L=x1, and M1.W=M2.W=M3.W=x2. In this example, there are two independent variables, x1 and x2. A design point is a particular value for x1 and x2. Examples of design points are {1u, 5u}, {10u, 10u}, and {100u, 500u}. The design space is the set of all design points. In this example, {x1, x2}={{1u, 5u}, {1u, 6u} . . . , and {1u, 500u}; {2u, 5u}, {2u, 6u} . . . , and {2u, 500u}; . . . {100u, 5u}, {100u, 6u} . . . , and {100u, 500u}}.

Unlike the simple example in FIG. 1c, design spaces for commercial integrated circuits may contain trillions of design points. It is challenging to effectively explore the entire design space of a complex integrated circuit using exhaustive search methods in evaluating each design point. Finding a design point, in such a large design space, that satisfies the user's design specifications is extremely time consuming. In practice, run times of a few hours to a few days are common, even when multiple computers are used to run evaluations in parallel. Therefore, there is a need for a method that substantially reduces the run time of an integrated circuit sizing operation. In particular, there is a need for an effective search process for finding design points that meet the user's design specifications.

SUMMARY

In one embodiment, a method for evaluating design costs of an integrated circuit includes choosing a design point for evaluation, dividing circuit specifications of the design point into at least two groups comprising a first group of specifications and a second group of specifications, computing a first set of design costs for the first group of specifications, estimating a second set of design costs for the second group of specifications using a predetermined set of reference costs, and determining a design cost of the design point using the first set of design costs and the second set of design costs.

In another embodiment, a system for evaluating design costs of an integrated circuit includes at least one processing unit for executing computer programs, a graphical-user-interface for viewing representations of the integrated circuit on a display, and a memory for storing databases of the integrated circuit. The system further includes means for choosing a design point for evaluation, means for dividing circuit specifications of the design point into at least two groups comprising a first group of specifications and a second group of specifications, means for computing a first set of design costs for the first group of specifications, means for estimating a second set of design costs for the second group of specifications using a predetermined set of reference costs, and means for determining a design cost of the design point using the first set of design costs and the second set of design costs.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 1a illustrates a conventional method for sizing an integrated circuit.

FIG. 1b illustrates another conventional method for sizing an integrated circuit.

FIG. 1c illustrates an example of a design space with a three-transistor integrated circuit.

DESCRIPTION OF EMBODIMENTS

Methods and systems are provided for evaluating design costs of an integrated circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

For purposes of the descriptions below, a target value for a specification is the value that the circuit designer would like the specification to achieve. Examples of circuit specifications include timing, area, temperature, performance, power, and design rule specifications. Typically, a circuit design requires that a specification value is greater than, less than or within a range of the target value, for example gain >60 dB. In this case, the specification of the gain has a target value of 60 dB, but any value greater than 60 dB is acceptable.

The cost of a design point is a measure of how far the design point is from meeting the desired target values (design specifications). Each design specification contributes to the total cost of a design point. If a design point meets its desired target value, it is likely to have a small or zero cost. If a design point is far from meeting its desired target values, its cost contribution is likely to be large. For example, let a circuit have design specifications, $s[1]$ through $s[n]$. Further, let the design cost (C1) of a particular design point (D1) be the sum of all of the individual cost components for each specification, $C1=C1,s[1]+C1,s[2]+\ldots+C1,s[n]$. Note that each design specification value is measured by using one or more circuit simulations.

Figure 2:
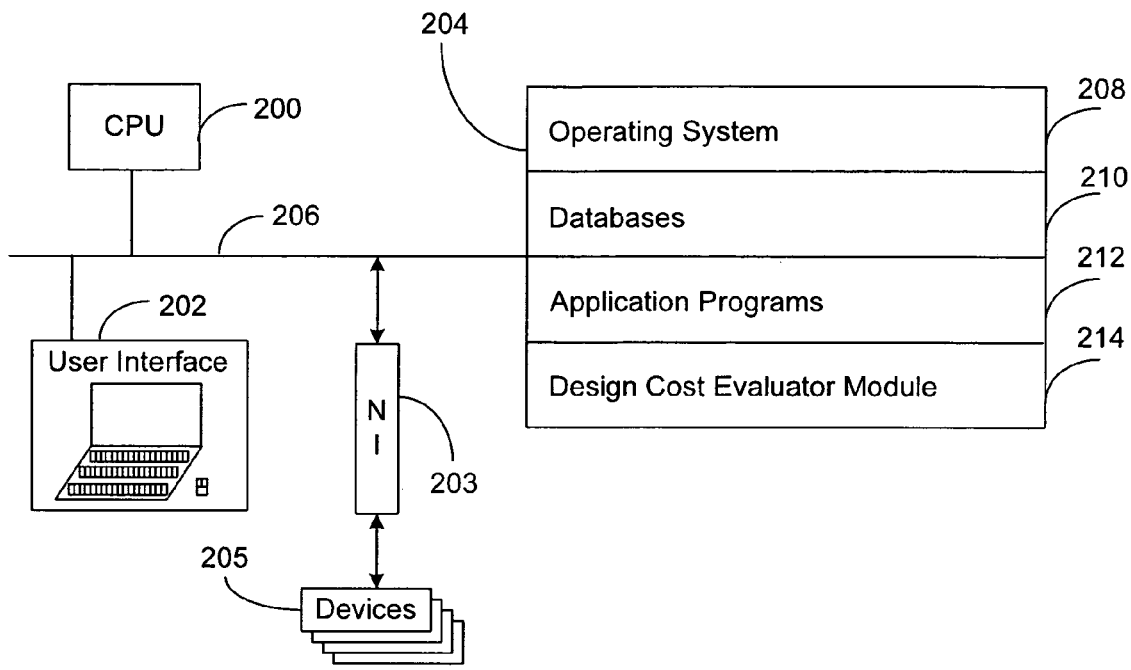
FIG. 2 illustrates an implementation of the design cost evaluator using a computer system according to an embodiment of the present invention.

In one embodiment, a design cost evaluator is implemented using a computer system schematically shown in FIG. 2. The computer system includes one or more central processing units (CPUs) 200, at least a user interface 202, a memory device 204, a system bus 206, and one or more bus interfaces for connecting the CPU, user interface, memory device, and system bus together. The computer system also includes at least one network interface 203 for communicating with other devices 205 on a computer network. In alternative embodiments, much of the functionality of the circuit simulator may be implemented in one or more application-specific integrated circuits (ASICs) or field-programmable gate arrays (FPGAs), thereby either eliminating the need for a CPU, or reducing the role of the CPU in generating the initial layout of the integrated circuit.

The memory device 204 may include high-speed random-access memory and may also include non-volatile memory, such as one or more magnetic disk storage devices. The memory device 204 may also include mass storage that is remotely located from the CPU(s) 200. The memory device 204 preferably stores:

- an operating system 208 that includes procedures for handling various basic system services and for performing hardware-dependent tasks;
- databases 210 for storing information of the integrated circuit;
- application programs 212 for performing other user-defined applications and tasks; and
- a design cost evaluator module 214 for evaluating design costs of an integrated circuit.

The database 210, the application programs 212, and the design cost evaluator module 114 may include executable procedures, sub-modules, tables, and other data structures. In other embodiments, additional or different modules and data structures may be used, and some of the modules and/or data structures listed above may not be used.

Figure 3:
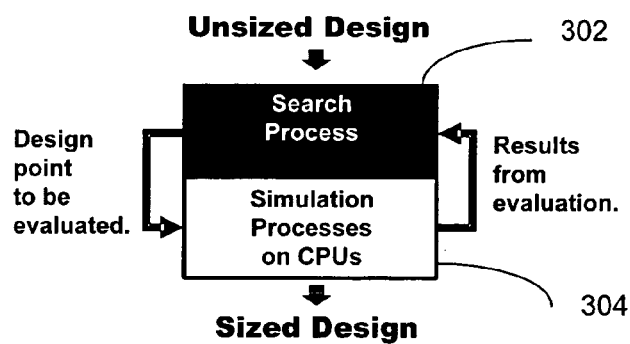
FIG. 3 illustrates an automatic sizing process according to an embodiment of the present invention.

FIG. 3 illustrates an automatic sizing process according to an embodiment of the present invention. The automatic sizing process is an optimization-based step that uses numerical techniques to search a defined design space. In step 302, the automatic sizing process performs a search on the unsized design received. The unsized design contains topology information without numerical values of the component parameters. The search identifies design points to be evaluated. In step 304, simulations are performed on the design to evaluate the design points identified in step 302. Results of the simulation are returned to the search and reference points of the design are updated accordingly. Steps 302 and 304 are repeated until the user's specifications of the design are met, and a sized design is then generated.

Figure 4:
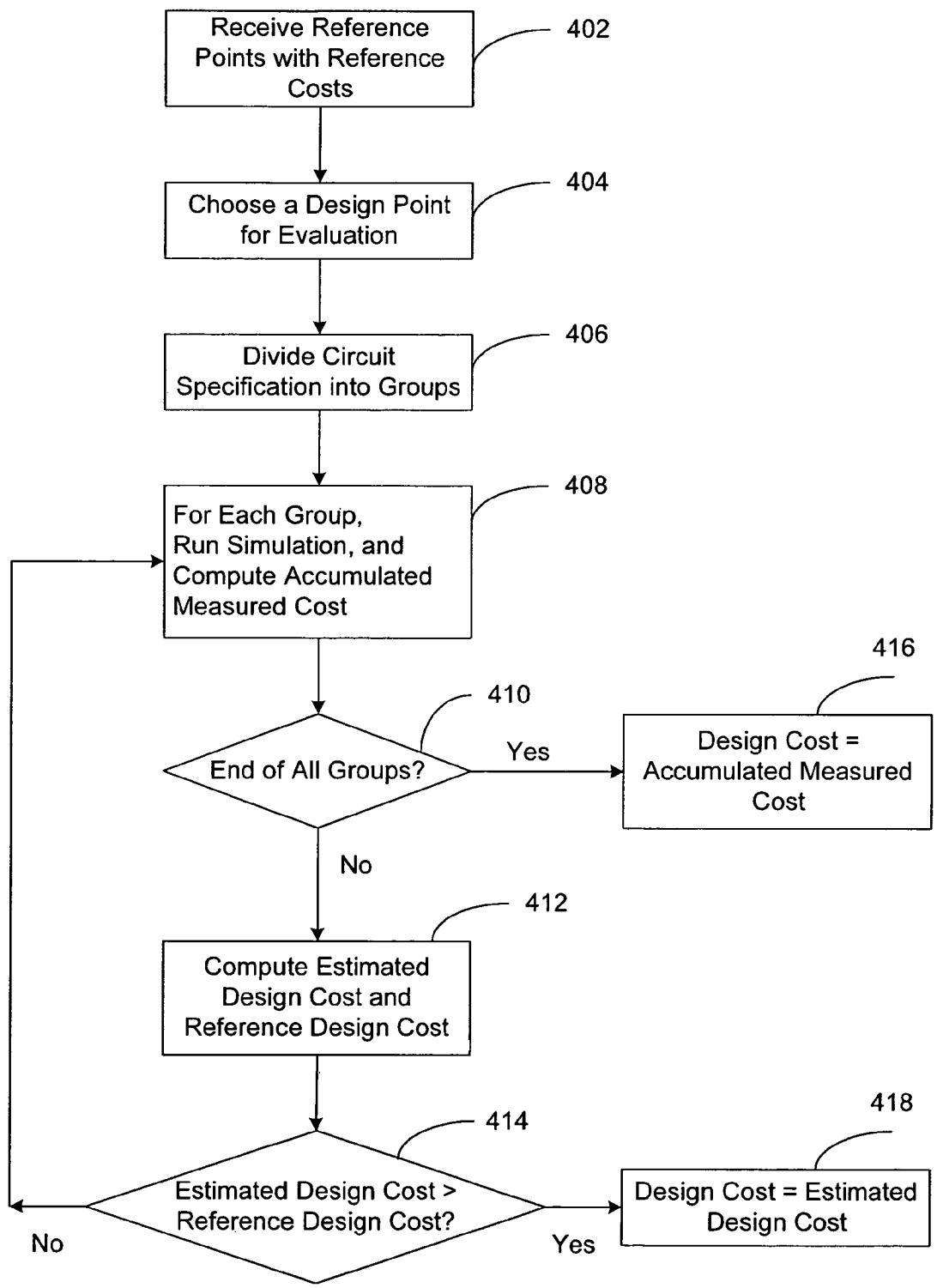
FIG. 4 illustrates a method for evaluating a design point according to an embodiment of the present invention.

FIG. 4 illustrates a method for evaluating a design point according to an embodiment of the present invention. In general, the disclosed method for evaluating design costs of an integrated circuit substantially reduces the average number of simulations required to evaluate a design point, which in turn substantially reduces the time for running an automatic sizing operation.

The method starts in step 402 where it receives a plurality of reference design points and their corresponding reference costs from the population of points which have been previously evaluated. The reference points (rp) is an array represented by $rp[1], rp[2a], \ldots, rp[m]$, $i=1 \ldots m$, and each reference point has an associated set of evaluated specification values, for example, $Crp[i]=Crp[i],s[1]+Crp[i],s[2a]+\ldots+Crp[i],s[n]$. Note that the reference design points and/or costs may be updated periodically during the course of the automatic sizing operation. Each specification value has either met the designer-specified target value or failed to meet the target value.

In step 404, a design point is chosen for evaluation. As a new design point is visited, decisions are made as to which simulations need to be performed and which simulation can be skipped. In step 406, the method divides the circuit specifications of the design point into at least two groups, for example p groups represented by $g[j]$, where $j=1 \ldots p$, and each group may contain one or more specifications $s[j,1]$, $s[j,2], \ldots$ etc. In one implementation, a first group of unmet specifications and a second group of met specifications, as defined by the design point, are considered separately. As the design point is visited, a subset of simulations is run to compute the unmet specifications. Using the simulated cost of the unmet specifications, an accumulated measured cost of the design point is computed as will be described below.

Next in step 408, the design point is evaluated against each group of the specifications in multiple steps. To evaluate a design point, one or more simulations are performed according to the group of specifications. Specification values are measured from the simulation results. A measured cost is a measure of how far the specification values are deviated from the target specification values. When evaluating a design point, only those simulations required to evaluate the specifications associated with a particular step are run first. If certain conditions are met on the specification values in one step, then the next step is run.

In one approach, the method computes an accumulated measured cost of the design point as follows: 1) simulate the design point to measure the design costs according to the specifications within the group; 2) compute a group cost using the design costs measured in step 1; and 3) compute the accumulated measured cost. The accumulated measured cost is a sum of the group cost computed in step 2 for all the groups that have been simulated thus far.

In step 410, a first determination is made as to whether the end of all groups of circuit specifications has been reached. If the end of all groups has been reached (410_yes), the method moves on to step 416. If the end of all groups has not been reached (410_no), the method continues to step 412.

In step 412, the method computes an estimated design cost using the accumulated measured cost from step 408 and the reference costs received in step 402. The estimated design cost is the sum of the accumulated measured cost for the groups which have been simulated thus far and an un-simulated group cost for the groups that have not been simulated. A reference design cost for all groups of specifications of the design point is also computed. Both the un-simulated group cost and the reference design cost are computed using the reference costs received in step 402.

In step 414, a second determination is made as to whether the estimated design cost computed in step 412 is larger than the reference design cost for all groups. If the estimated design cost is larger than the reference design cost (414_yes), the method goes to step 418. If the estimated design cost is not larger than the reference design cost (414_no), the method goes to step 408 to continue evaluating other groups for the design point. In other words, if the estimated design cost is larger than the reference design cost, indicating the design point being evaluated is farther from meeting the target specifications, the design point is discarded and no further simulations are necessary. If the estimated design cost is not larger than the reference design cost, indicating the design point being evaluated is closer to meeting the target specifications than the reference points thus far, a next group is simulated and a new accumulated measured cost is calculated with the simulated design costs of the next group. The process is repeated until the method reaches step 416 or step 418.

In step 416, the accumulated measured cost is assigned to be the design cost for the design point. This is the scenario where all groups of the circuit specifications have been evaluated and the actual measured costs are used to obtain the design cost (step 410_yes).

In step 418, the estimated design cost is assigned to be the design cost for the design point. Note that at certain particular points in the multi-step evaluation process, enough information may have been gathered to determine the design cost using the estimated design cost. If the estimated design cost is such that the design point can be ruled out as an interesting point (for example no longer has the potential for a lower design cost than the reference points), then the estimated design cost is returned as the design cost for the point. Once step 418 is reached, there is no longer a need to run simulations to calculate the specification values for the remaining groups.

In one embodiment, the method shown in FIG. 4 is applied to evaluate a design cost using a single, low-cost reference point. The method first receives the reference point and its corresponding reference cost. The method chooses a design point for evaluation that meets some specifications but does not meet some other specifications. The method then divides the specifications of the design point into two groups, namely g[1] and g[2], where g[1] contains the specifications that are not met and g[2] contains the specifications that are met. Next, for the group g[1a], the method performs the following steps: 1) run the simulations for the specifications in g[1]; 2) compute a group cost of the design point; and 3) compute an accumulated measured cost $C_{measured}$, which is the group cost of g[1] thus far. Then the method determines whether all groups of specifications have been evaluated. Here, since g[2] has not been evaluated, the method then computes an estimated design cost $C_{estimated}$, which is the sum of $C_{measured}$ for the group(s) that have been simulated thus far (g[1]) and an un-simulated group cost for the group(s) that have not been simulated (g[2]). A reference design cost $C_{reference}$ for all groups of specifications (g[1] and g[2]) is also computed using the previous evaluated reference point.

Next, the method compares $C_{estimated}$ to $C_{reference}$. If $C_{estimated}$ is greater than $C_{reference}$, then the method uses $C_{estimated}$ as the design cost for the design point and returns $C_{estimated}$. If $C_{estimated}$ is less than or equal to $C_{reference}$, then the method continues to run simulations for the specifications that are in g[2]. The steps are repeated until all of the groups have been evaluated or until $C_{estimated}$ is greater than $C_{reference}$. When all groups have been evaluated, the actual cost of the design point, $C_{measured}$, is returned. Note that in the scenario when $C_{estimated}$ is greater than $C_{reference}$, the simulations required to compute the cost for g[2] are avoided, which lead to saving simulation time and computation resources.

In another embodiment, the method described in FIG. 4 is applied to estimate design point cost using reference points that are close to each other in the design space. The method first receives multiple reference points and their corresponding reference costs that are near (in the design space) to the design point being evaluated. The method then divides the specifications into m groups, namely g[1a] through g[m], where g[1] contains specifications that simulate the fastest, g[m] contains specifications that simulate the slowest, and the remaining specifications are assigned to groups between 1 and m (for simplicity of illustration, assume that m is 2). Next, for the group g[i], where i=1 . . . m, the method performs the following steps: 1) run the simulations for the specifications in g[i]; 2) compute a group cost of the design point; 3) compute an accumulated measured cost, $C_{measured}$, which is the group cost of the group(s) that have been simulated thus far. Then, the method determines whether all groups of specifications have been evaluated. If not all groups have been evaluated, the method then computes an estimated design cost, $C_{estimated}$, which is the sum of $C_{measured}$ for the group(s) that have been simulated thus far (g[1] to g[i]) and an un-simulated group cost for the group(s) that have not been simulated (g[i+1] to g[m]). A reference design cost, $C_{reference}$, for all groups of specifications (g[1] to g[m]) is also computed using the multiple reference costs previously evaluated.

Next, the method compares $C_{estimated}$ to $C_{reference}$. If $C_{estimated}$ is greater than $C_{reference}$, then the method uses $C_{estimated}$ as the design cost for the design point and returns $C_{estimated}$. If $C_{estimated}$ is less than or equal to $C_{reference}$, then the method continues to run simulations for the next group of specifications (g[i+1]). The steps are repeated until all the groups have been evaluated (i=m) or until $C_{estimated}$ is greater than $C_{reference}$. When all groups have been evaluated, the actual cost of the design point, $C_{measured}$, is returned. Note that in the scenario when $C_{estimated}$ is greater than $C_{reference}$, the simulations required to compute the cost for the groups g[i+1] to g[m] are avoided, which lead to saving simulation time and computation resources.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally, and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for evaluating design costs of an integrated circuit, comprising:
    choosing a design point for evaluation;
    dividing circuit specifications of the design point into at least two groups comprising a first group of specifications and a second group of specifications;
    computing a first set of design costs for the first group of specifications;
    estimating a second set of design costs for the second group of specifications using a predetermined set of reference costs; and
    determining a design cost of the design point using the first set of design costs and the second set of design costs.

2. The method of claim 1, wherein the circuit specifications comprise:
    timing, area, temperature, power, performance, and design rule specifications.

3. The method of claim 1, wherein the first group of specifications comprises a group of specifications that are not met by the design point.

4. The method of claim 1, wherein the second group of specifications comprises a group of specifications that are met by the design point.

5. The method of claim 1, wherein computing a first set of design costs comprises:
    simulating the design point to measure the first set of design costs in accordance with the first group of specifications.

6. The method of claim 1, wherein estimating the second set of design costs comprises:
    assigning values from the predetermined set of reference costs to corresponding values in the second set of design costs.

7. The method of claim 6, wherein estimating a second set of design costs is performed without simulating the design point according to the second group of specifications.

8. The method of claim 1, wherein determining a design cost comprises:
    computing a reference design cost by summing reference costs for both the first and second groups of specifications from the predetermined set of reference costs;
    computing an estimated design cost by summing the first and second sets of design costs;
    if the estimated design cost is larger than the reference design cost, assigning the estimated design cost as the design cost; and
    if the estimated design cost is not larger than the reference design cost, evaluating the circuit specifications to determine a new estimated design cost.

9. The method of claim 1 further comprising:
    for each group, simulating a group cost according to a corresponding set of specifications of the group; and
    computing an accumulated measured cost by summing the group cost of each group that has been simulated.

10. The method of claim 9 further comprising:
    if all groups of the circuit specifications have been simulated, assigning the accumulated measured cost as the design cost; and
    if all groups of the circuit specifications have not been simulated, computing an estimated design cost.

11. The method of claim 10, wherein computing an estimated design cost comprises:
    computing an un-simulated group cost by summing reference costs of groups that have not been simulated; and
    calculating the estimated design cost by summing the accumulated measured cost and the un-simulated group cost.

12. The method of claim 10 further comprising:
    computing a reference design cost by summing reference costs for all groups of specifications from the predetermined set of reference costs;
    if the estimated design cost is larger than the reference design cost, assigning the estimated design cost as the design cost; and
    if the estimated design cost is not larger than the reference design cost, evaluating other groups of specifications to determine a new estimated design cost.

13. A computer program product, comprising a medium storing programs for execution by one or more computer systems, the computer program product comprising:
    a design cost evaluator module for evaluating design costs of an integrated circuit, wherein the design cost evaluator module is used in conjunction with at least a microprocessor unit, a memory, and a user interface, and the design cost evaluator module includes one or more computer programs containing instructions for:

choosing a design point for evaluation;
dividing circuit specifications of the design point into at least two groups comprising a first group of specifications and a second group of specifications;
computing a first set of design costs for the first group of specifications;
estimating a second set of design costs for the second group of specifications using a predetermined set of reference costs; and
determining a design cost of the design point using the first set of design costs and the second set of design costs.

14. The computer program product of claim 13, wherein the circuit specifications comprise:
timing, area, temperature, power, performance, and design rule specifications.

15. The computer program product of claim 13, wherein the first group of specifications comprises a group of specifications that are not met by the design point.

16. The computer program product of claim 13, wherein the second group of specifications comprises a group of specifications that are met by the design point.

17. The computer program product of claim 13, wherein the instructions for computing a first set of design costs comprise:
simulating the design point to measure the first set of design costs in accordance with the first group of specifications.

18. The computer program product of claim 13, wherein the instructions for estimating the second set of design costs comprise:
assigning values from the predetermined set of reference costs to corresponding values in the second set of design costs.

19. The computer program product of claim 18, wherein the instructions for estimating a second set of design costs are performed without simulating the design point according to the second group of specifications.

20. The computer program product of claim 13, wherein the instructions for determining a design cost comprise:
computing a reference design cost by summing reference costs for both the first and second groups of specifications from the predetermined set of reference costs;
computing an estimated design cost by summing the first and second sets of design costs;
if the estimated design cost is larger than the reference design cost, assigning the estimated design cost as the design cost; and
if the estimated design cost is not larger than the reference design cost, evaluating the circuit specifications to determine a new estimated design cost.

21. The computer program product of claim 13 wherein said one or more computer programs further comprising instructions for:
for each group, simulating a group cost according to a corresponding set of specifications of the group; and
computing an accumulated measured cost by summing the group cost of each group that has been simulated.

22. The computer program product of claim 21 wherein said one or more computer programs further comprising instructions for:
if all groups of the circuit specifications have been simulated, assigning the accumulated measured cost as the design cost; and
if all groups of the circuit specifications have not been simulated, computing an estimated design cost.

23. The computer program product of claim 22, wherein the instructions for computing an estimated design cost comprise:
computing an un-simulated group cost by summing reference costs of groups that have not been simulated; and
calculating the estimated design cost by summing the accumulated measured cost and the un-simulated group cost.

24. The computer program product of claim 22 wherein said one or more computer programs further comprising instructions for:
computing a reference design cost by summing reference costs for all groups of specifications from the predetermined set of reference costs;
if the estimated design cost is larger than the reference design cost, assigning the estimated design cost as the design cost; and
if the estimated design cost is not larger than the reference design cost, evaluating other groups of specifications to determine a new estimated design cost.

25. A system for evaluating design costs of an integrated circuit, comprising:
at least one processing unit for executing computer programs;
a graphical-user-interface for viewing representations of the integrated circuit on a display;
a memory for storing databases of the integrated circuit;
means for choosing a design point for evaluation;
means for dividing circuit specifications of the design point into at least two groups comprising a first group of specifications and a second group of specifications;
means for computing a first set of design costs for the first group of specifications;
means for estimating a second set of design costs for the second group of specifications using a predetermined set of reference costs; and
means for determining a design cost of the design point using the first set of design costs and the second set of design costs.

26. The system of claim 25, wherein the circuit specifications comprise:
timing, area, temperature, power, performance, and design rule specifications.

27. The system of claim 25, wherein the first group of specifications comprises a group of specifications that are not met by the design point.

28. The system of claim 25, wherein the second group of specifications comprises a group of specifications that are met by the design point.

29. The system of claim 25, wherein the means for computing a first set of design costs comprise:
means for simulating the design point to measure the first set of design costs in accordance with the first group of specifications.

30. The system of claim 25, wherein the means for estimating the second set of design costs comprise:
means for assigning values from the predetermined set of reference costs to corresponding values in the second set of design costs.

31. The system of claim 30, wherein the means for estimating a second set of design costs are performed without means for simulating the design point according to the second group of specifications.

32. The system of claim 25, wherein the means for determining a design cost comprise:

means for computing a reference design cost by summing reference costs for both the first and second groups of specifications from the predetermined set of reference costs;

means for computing an estimated design cost by summing the first and second sets of design costs;

if the estimated design cost is larger than the reference design cost, means for assigning the estimated design cost as the design cost; and if the estimated design cost is not larger than the reference design cost, means for evaluating the circuit specifications to determine a new estimated design cost.

33. The system of claim 25 further comprising:

for each group, means for simulating a group cost according to a corresponding set of specifications of the group; and means for computing an accumulated measured cost by summing the group cost of each group that has been simulated.

34. The system of claim 33 further comprising:

if all groups of the circuit specifications have been simulated, means for assigning the accumulated measured cost as the design cost; and if all groups of the circuit specifications have not been simulated, means for computing an estimated design cost.

35. The system of claim 34, wherein the means for computing an estimated design cost comprise:

means for computing an un-simulated group cost by summing reference costs of groups that have not been simulated; and means for calculating the estimated design cost by summing the accumulated measured cost and the un-simulated group cost.

36. The system of claim 34 further comprising:

means for computing a reference design cost by summing reference costs for all groups of specifications from the predetermined set of reference costs;

if the estimated design cost is larger than the reference design cost, means for assigning the estimated design cost as the design cost; and if the estimated design cost is not larger than the reference design cost, means for evaluating other groups of specifications to determine a new estimated design cost.

* * * * *